US009959939B2

(12) United States Patent
Fahim et al.

(10) Patent No.: US 9,959,939 B2
(45) Date of Patent: May 1, 2018

(54) GRANULAR CACHE REPAIR

(71) Applicant: Intel Corporation, Santa Clara, CA (US)

(72) Inventors: Bahaa Fahim, Santa Clara, CA (US); Min Huang, Cupertino, CA (US); Zhiguo Wang, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 292 days.

(21) Appl. No.: 14/581,686

(22) Filed: Dec. 23, 2014

(65) Prior Publication Data
US 2016/0179675 A1 Jun. 23, 2016

(51) Int. Cl.
G06F 12/06 (2006.01)
G11C 29/00 (2006.01)
G06F 11/08 (2006.01)
G06F 12/0895 (2016.01)
G06F 11/00 (2006.01)
G11C 15/04 (2006.01)
G06F 11/10 (2006.01)
G06F 11/16 (2006.01)

(52) U.S. Cl.
CPC ............. G11C 29/78 (2013.01); G06F 11/00 (2013.01); G06F 11/08 (2013.01); G06F 12/0638 (2013.01); G06F 12/0895 (2013.01); G06F 11/10 (2013.01); G06F 11/1064 (2013.01); G06F 11/1666 (2013.01); G11C 15/04 (2013.01)

(58) Field of Classification Search
None
See application file for complete search history.

(56) References Cited

U.S. PATENT DOCUMENTS

| 6,205,223 | B1* | 3/2001 | Rao ..................... G10L 19/00 341/51 |
| 6,212,602 | B1* | 4/2001 | Wicki ................. G06F 12/0897 711/118 |
| 2007/0168836 | A1* | 7/2007 | Dempsey ............. G11C 29/808 714/763 |
| 2008/0008015 | A1* | 1/2008 | Darbinyan ........... G11C 29/802 365/200 |
| 2008/0019198 | A1* | 1/2008 | Co ......................... G11C 5/04 365/201 |
| 2010/0211853 | A1* | 8/2010 | Madan ................ G06F 11/1048 714/773 |

(Continued)

Primary Examiner — Midys Rojas
Assistant Examiner — Stephanie Wu
(74) Attorney, Agent, or Firm — Lowenstein Sandler LLP

(57) ABSTRACT

Systems and methods for granular cache repair. An example processing system comprises a processing core communicatively coupled to a cache via a cache controller and a cache repair memory communicatively coupled to the cache controller. The cache controller is configured, responsive to receiving a read request referencing a physical address, to: retrieve cache data from a cache location identified by the physical address, retrieve, in parallel with retrieving the cache data, cache repair data from the cache repair memory, the cache repair data associated with the cache location, the cache repair data comprising at least one of: a bit repair value, a column repair value, and a raw repair value, and output the cache data multiplexed with the cache repair data.

18 Claims, 13 Drawing Sheets

(56) References Cited

U.S. PATENT DOCUMENTS

| | | | |
|---|---|---|---|
| 2011/0231736 A1* | 9/2011 | Toops | G06F 11/1016 |
| | | | 714/768 |
| 2013/0212431 A1* | 8/2013 | Ong | G06F 15/167 |
| | | | 714/15 |
| 2014/0082453 A1* | 3/2014 | Sikdar | G11C 29/808 |
| | | | 714/763 |
| 2015/0100848 A1* | 4/2015 | Kalamatianos | G06F 11/1008 |
| | | | 714/764 |
| 2015/0162101 A1* | 6/2015 | Ware | G11C 29/846 |
| | | | 714/764 |

\* cited by examiner

GRANULAR CACHE REPAIR

TECHNICAL FIELD

The present disclosure is generally related to computer systems, and is specifically related to systems and methods for efficiently utilizing redundant memory for repairing cache defects.

BACKGROUND

"Cache" herein shall refer to a memory component residing on or close to a processing core for storing certain data items that are duplicates of original data items, which in turn are stored in the main system memory, in order to optimize servicing future requests for those data items. A requested for a data item that is stored in the cache (cache hit) may be services by reading the cache, rather than the main system memory.

Variations of the production process employed in memory circuit manufacturing may lead to certain defects in a memory circuit that is utilized as a processor cache. Such defects may be diagnosed at the production testing stage.

BRIEF DESCRIPTION OF THE DRAWINGS

The present disclosure is illustrated by way of examples, and not by way of limitation, and may be more fully understood with references to the following detailed description when considered in connection with the figures, in which.

DETAILED DESCRIPTION

Figure 1:
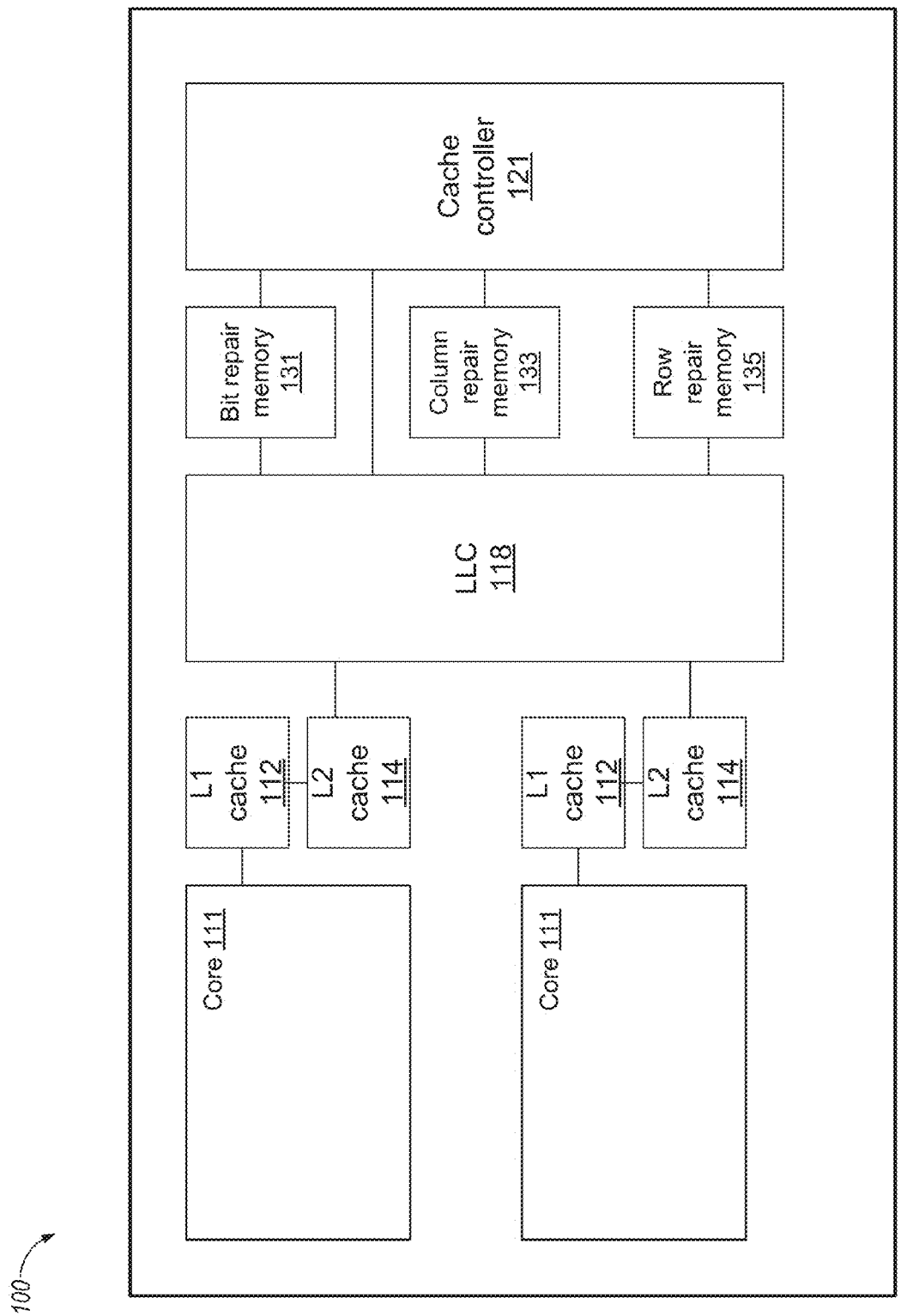
FIG. 1 depicts a high-level component diagram of an example processing system, in accordance with one or more aspects of the present disclosure.

Described herein are processing systems and related methods for granular cache repair.

A processor cache may comprise one or more memory banks, such that each bank may be organized in rows and columns. The production testing process may identify various memory defects, including defects of cache rows, cache columns, and/or individual cache bits. A programmable logical circuit (such as a circuit comprising a plurality of fuses) may be utilized to identify the defective cache locations. The cache controller may be configured to direct cache access operations with respect to one of the defective locations to a cache repair memory that may be allocated in or near the cache.

The present disclosure provides an efficient granular cache repair mechanism for repairing cache rows, cache columns, and/or individual cache bits, such that a cache access operation with respect to a defective cache location may be serviced by a corresponding repair memory location without introducing any additional latency. In certain implementations, methods of the present disclosure may utilize a register file for storing the cache repair data, and may further utilize content-addressable memory (CAM) for storing identifiers of cache locations for which the cache repair data is stored by the register file. The cache repair memory location associated with a particular cache location may be identified by the physical address and the cache hit way, as described in more details herein below.

Responsive to receiving a read request, the cache controller may, in parallel with retrieving the cache data from the cache, extract the cache repair data (a specific bit, column, or row) from the cache repair memory. In an illustrative example, the cache controller may look up the cache repair CAM by the physical address and the identifier of the cache hit way (i.e., the cache way that stores the data referenced by the physical address). If the cache repair CAM returns a hit, the cache controller may extract the cache repair data (a specific bit, column, or row) from the register file, at the location identified by the index of the CAM hit. The cache controller may multiplex the retrieved cache repair data with the cache data to be returned to the requesting agent.

A cache write operation may be performed in a manner symmetric to the above described cache read operation: responsive to receiving a cache write request, the cache controller may, in parallel with writing the data specified by the request to a cache location identified by the physical address specified by the request, also look up the cache repair memory (e.g., cache repair CAM) by the physical address and the identifier of the cache hit way corresponding to the physical address. If the cache repair CAM returns a hit, the cache controller may write at least part of the data into the cache repair memory location (e.g., the register file location) identified by the index of the CAM hit.

Various aspects of the above referenced methods and systems are described in more details herein below by way of examples, rather than by way of limitation.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation in order to provide a thorough understanding of the present disclosure. It will be apparent, however, to one skilled in the art that these specific details need not be employed to practice the methods disclosed herein. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

Although the following examples are described with reference to a processor, other implementations are applicable to other types of integrated circuits and logic devices. Similar techniques and teachings of examples described herein can be applied to other types of circuits or semiconductor devices that can benefit from higher pipeline throughput and improved performance. The teachings of examples described herein are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed.

The examples illustrating the present disclosure and accompanied drawings should not be construed in a limiting sense as they are merely intended to provide examples of embodiments described herein rather than to provide an exhaustive list of all possible implementations of embodiments described herein. Although the below examples describe instruction handling and distribution in the context of execution units and logic circuits, other implementations of the systems and methods described herein can be accomplished by way of a data or instructions stored on a machine-readable, tangible medium, which when performed by a machine cause the machine to perform functions consistent with at least one embodiment described herein. In certain implementations, functions associated with embodiments described herein are embodied in machine-executable instructions. The instructions can be used to cause a general-purpose or special-purpose processor that is programmed with the instructions to perform the methods described herein. Implementations described herein may be provided as a computer program product or software which may include a machine or computer-readable medium having stored thereon instructions which may be used to program a computer (or other electronic devices) to perform one or more operations according to embodiments described herein. Alternatively, operations of systems and methods described herein may be performed by specific hardware components that contain fixed-function logic for performing the operations, or by any combination of programmed computer components and fixed-function hardware components.

Instructions used to program logic to perform the methods described herein can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

"Processor" herein shall refer to a device capable of executing instructions encoding arithmetic, logical, or I/O operations. In one illustrative example, a processor may follow Von Neumann architectural model and may include an arithmetic logic unit (ALU), a control unit, and a plurality of registers. In a further aspect, a processor may include one or more processing cores, and hence may be a single core processor which is typically capable of processing a single instruction pipeline, or a multi-core processor which may simultaneously process multiple instruction pipelines. In another aspect, a processor may be implemented as a single integrated circuit, two or more integrated circuits, or may be a component of a multi-chip module (e.g., in which individual microprocessor dies are included in a single integrated circuit package and hence share a single socket).

Referring now to FIG. 1, shown is a block diagram of an example processing system 100 in accordance with one or more aspects of the present disclosure. As illustrated, processing system 100 may comprise one or more processing cores 111 and associated cache hierarchy. Processing cores 111 in various implementations may be provided by in-order cores or out-or-order cores. In an illustrative example, processing core 111 may have a micro-architecture including processor logic and circuits used to implement an instruction set architecture (ISA). Processors with different micro-architectures can share at least a portion of a common instruction set. For example, the same register architecture of the ISA may be implemented in different ways in different micro-architectures using various techniques.

Processing core 111 may be communicatively coupled to a first level (L1) cache 112 which, in turn, may be communicatively coupled to a mid-level cache (MLC) 114. In turn, MLC 114 may be communicatively coupled to a last level cache (LLC) 118. While FIG. 1 schematically a three-level cache hierarchy with a shared LLC, the scope of the present disclosure is not limited in this regard, and in different implementations a two-level cache hierarchy, a cache hierarchy having greater than three levels, or a cache hierarchy with private LLCs may be provided. Also, while examples illustrating the present disclosure refer systems and methods for repairing LLC 118, in certain implementations other cache levels may be repaired in accordance with one or more aspects of the present disclosure.

Processor 100 may further comprise a cache controller 121 communicatively coupled to LLC 118. In accordance with one or more aspects of the present disclosure, cache controller 121 may be communicatively coupled to the cache repair memory comprising bit repair memory 131, column repair memory 133, and row repair memory 135. Operation of cache controller 121 is described in more details herein below with references to FIGS. 2A-2B. While not shown in FIG. 1, various additional components may be present within processor 100.

Figure 2A:
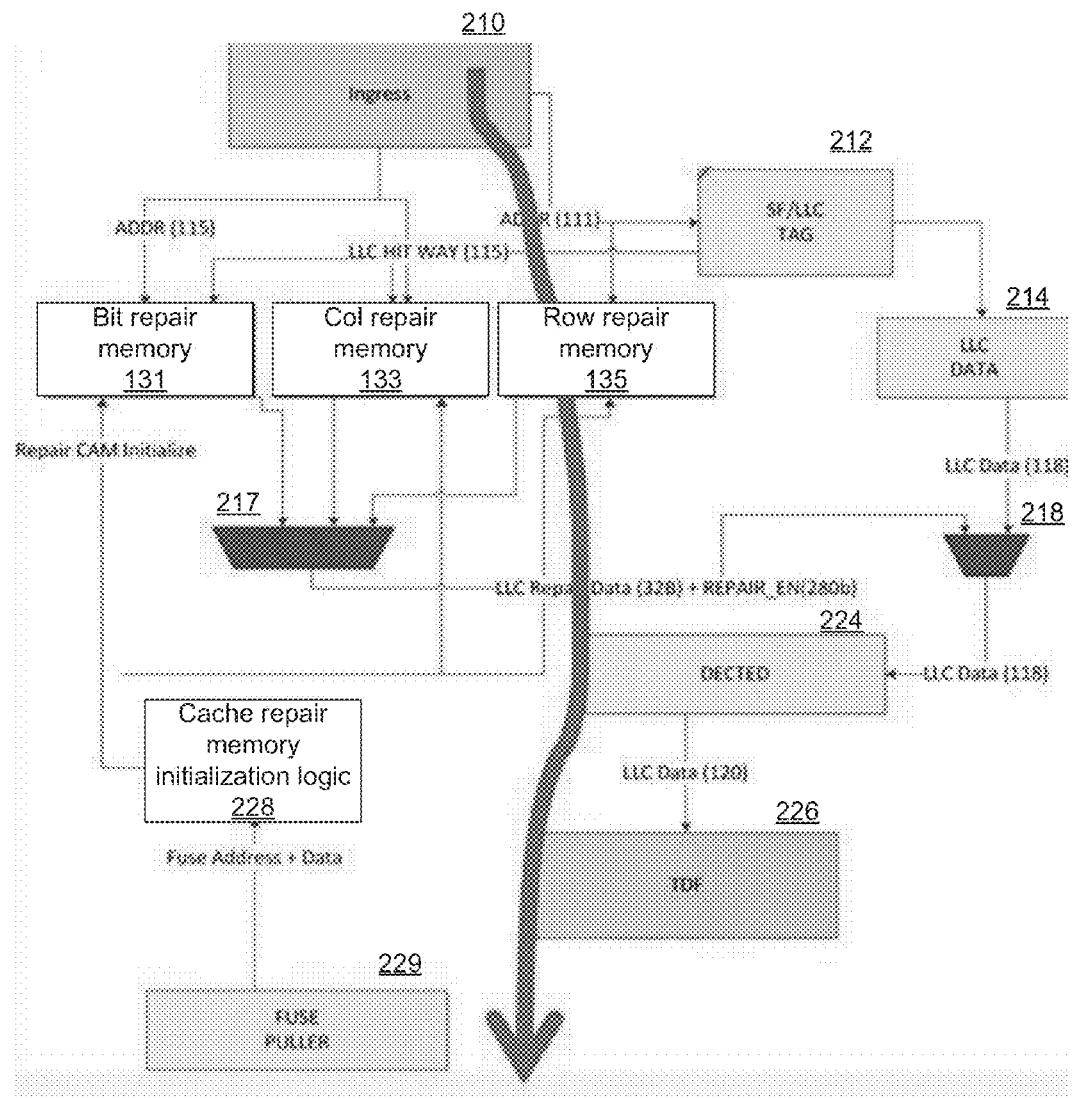
FIG. 2A schematically illustrates an example implementation of the LLC read pipeline, in accordance with one or more aspects of the present disclosure.

FIG. 2A schematically illustrates an example implementation of the LLC read pipeline, in accordance with one or more aspects of the present disclosure. Referring to FIG. 2A, a read request received by ingress module 210 of cache controller 121 may comprise a memory physical address identifying the cache location to be read. In common implementations, the physical address may be supplied to a snoop filter/LLC tag module 212 comprising a tag directory indexing LLC data 214.

In accordance with one or more aspects of the present disclosure, the physical address may be combined with the identifier of the LLC hit way (i.e., the cache way that stores the data referenced by the physical address), and the resulting combination may be utilized for indexing the cache repair memory comprising bit repair memory 131, column repair memory 133, and row repair memory 135.

In certain implementations, each of bit repair memory 131, column repair memory 133, and row repair memory 135 may comprise a first cache repair memory portion to store the cache repair data and a second cache repair memory portion to store identifiers of cache locations for which the cache repair data is stored by the first cache repair memory portion, as described in more details herein below with reference to FIGS. 3A-3C. In various illustrative examples, the first cache repair memory portion is provided by a register file and the second cache repair memory portion is provided by content-addressable memory (CAM).

Outputs of the cache repair memory modules 131, 133, and 135 may be multiplexed by a multiplexer 217 to produce the cache repair data, which may then be multiplexed, by a multiplexer 217B with the LLC data to produce the resulting data item to be fed into an error-correcting code (ECC) module 224. After the ECC processing, the resulting cache data may be provided to downstream logic 226.

The cache repair memory lookup and read operations may be performed in parallel with executing the conventional LLC read pipeline, e.g., within the three pipeline stages separating the identification of an LLC hit (an LLC tag that is produced by snoop filter/LLC tag module 212) and the LLC data becoming available. FIG. 2A shows pipeline stage labels to illustrate the parallelism of the cache repair memory lookup and read operations. As the cache repair memory lookup and read operations are performed in parallel with executing the conventional LLC read pipeline, no additional latency is introduced into the cache pipeline by the above described cache repair functionality.

In accordance with one or more aspects of the present disclosure, cache controller 121 may further comprise cache repair memory initialization logic 228 configured to initialize the cache repair memory by reading a programmable circuit 229 associated with the cache. In an illustrative example, the programmable circuit may comprise a plurality of fuses that may be set and/or cleared at the production testing stage responsive to identifying defects of cache rows, cache columns, and/or individual cache bits. Upon the processor reset, cache controller 121 may be configured to read cache repair memory initialization logic 228 in order to initialize the cache repair memory.

Figure 2B:
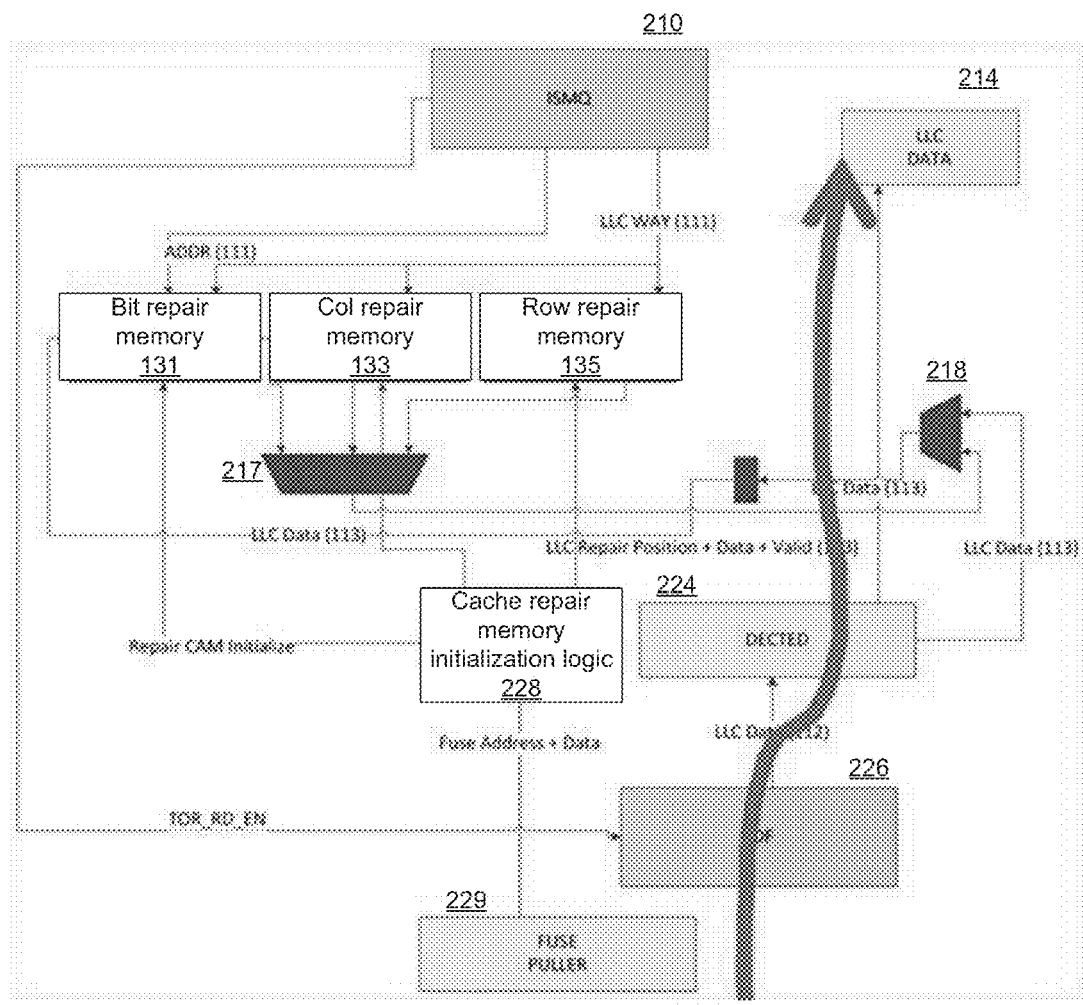
FIG. 2B schematically illustrates an example implementation of the LLC write pipeline, in accordance with one or more aspects of the present disclosure.

FIG. 2B schematically illustrates an example implementation of the LLC write pipeline, in accordance with one or more aspects of the present disclosure. Referring to FIG. 2B, a write request received by ingress module 210 of cache controller 121 may comprise a data item and a memory physical address identifying the cache location to which the data item should be written.

In accordance with one or more aspects of the present disclosure, the physical address may be combined with the identifier of the LLC way that stores the data item, and the resulting combination may be utilized for indexing the cache repair memory comprising bit repair memory 131, column repair memory 133, and row repair memory 135. Outputs of the cache repair memory modules 131, 133, and 135 may be multiplexed by a multiplexer 217 to identify the cache repair memory location in which the cache repair data associated with the cache location should be stored. The output of multiplexer 218 is then multiplexed, by a multiplexer 218, with the LLC data to produce the resulting data item which is then stored in the cache repair memory.

The cache repair memory lookup and write operations may be performed in parallel with executing the conventional LLC write pipeline. FIG. 2B shows pipeline stage labels to illustrate the parallelism of the cache repair memory lookup and read operations. As the cache repair memory lookup and write operations are performed in parallel with executing the conventional LLC write pipeline, no additional latency is introduced into the cache pipeline by the above described cache repair functionality.

Figure 3A:
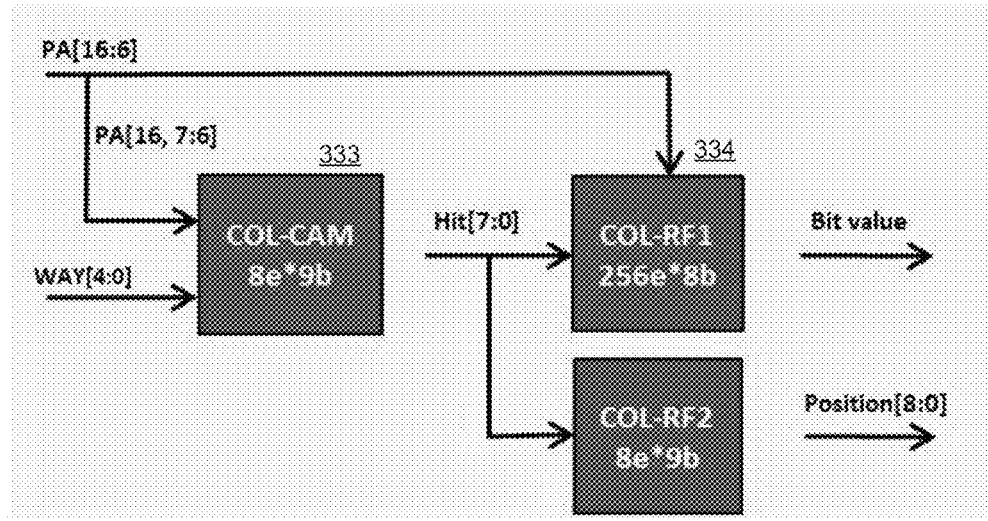
FIGS. 3A-3C schematically illustrate example circuits for indexing the cache repair memory, in accordance with one or more aspects of the present disclosure.
Figure 3B:
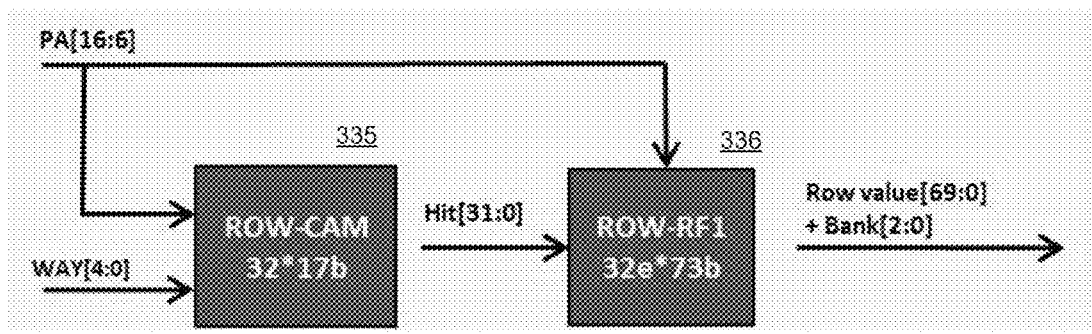
Figure 3C:
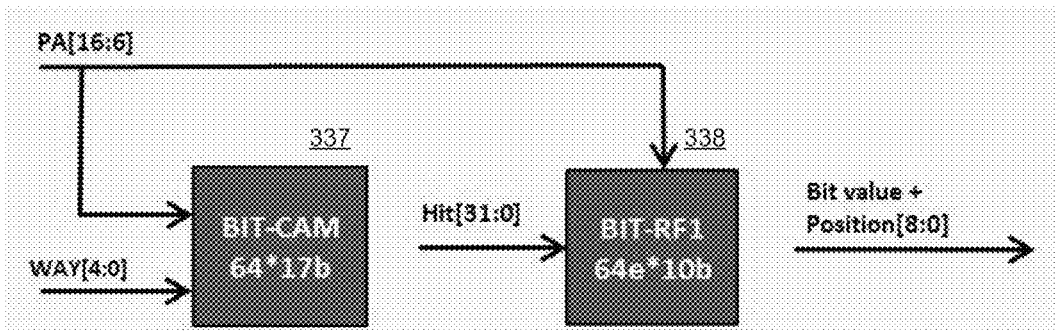

FIGS. 3A-3C schematically illustrate example circuits for indexing the cache repair memory, in accordance with one or more aspects of the present disclosure. As noted herein above, in certain implementations, each of bit repair memory 131, column repair memory 133, and row repair memory 135 may comprise a first cache repair memory portion to store the cache repair data and a second cache repair memory portion to store identifiers of cache locations for which the cache repair data is stored by the first cache repair memory portion. In various illustrative examples, the first cache repair memory portion is provided by a register file and the second cache repair memory portion is provided by content-addressable memory (CAM).

Referring to FIG. 3A, cache controller 120 may be configured to retrieve column cache repair data from the column cache repair memory by looking up, in column cache repair CAM 333, at least a portion of the physical address and the identifier of the cache hit way corresponding to the physical address. If column cache repair CAM 333 returns a hit, cache controller 121 may retrieve the column cache repair data from register file 334, at the location identified by the index returned by the CAM hit. In accordance with one or more aspects of the present disclosure, retrieving the cache repair data may be performed in parallel with retrieving the cache data. In an illustrative example, cache repair memory lookup and read operations may be performed in parallel with executing the conventional LLC read pipeline.

Cache controller 120 may be further configured to write column cache repair data by looking up, in column cache repair CAM 333, at least a portion of the physical address and the identifier of the cache hit way corresponding to the physical address. If column cache repair CAM 333 returns a hit, cache controller 121 may store the column cache repair data in register file 334, at the location identified by the index returned by the CAM hit. In accordance with one or more aspects of the present disclosure, storing the cache repair data may be performed in parallel with storing the cache data. In an illustrative example, cache repair memory lookup and write operations may be performed in parallel with executing the conventional LLC write pipeline.

Referring to FIG. 3B, cache controller 120 may be configured to retrieve row cache repair data from the row cache repair memory by looking up, in row cache repair CAM 335, at least a portion of the physical address and the identifier of the cache hit way corresponding to the physical address. If row cache repair CAM 335 returns a hit, cache controller 121 may retrieve the row cache repair data from register file 336, at the location identified by the index returned by the CAM hit. In accordance with one or more aspects of the present disclosure, retrieving the cache repair data may be performed in parallel with retrieving the cache data. In an illustrative example, cache repair memory lookup and read operations may be performed in parallel with executing the conventional LLC read pipeline.

Cache controller 120 may be further configured to write row cache repair data by looking up, in row cache repair CAM 335, at least a portion of the physical address and the identifier of the cache hit way corresponding to the physical address. If row cache repair CAM 335 returns a hit, cache controller 121 may store the row cache repair data in register file 336, at the location identified by the index returned by the CAM hit. In accordance with one or more aspects of the present disclosure, storing the cache repair data may be performed in parallel with storing the cache data. In an illustrative example, cache repair memory lookup and write operations may be performed in parallel with executing the conventional LLC write pipeline.

Referring to FIG. 3C, cache controller 120 may be configured to retrieve bit cache repair data from the bit cache repair memory by looking up, in bit cache repair CAM 337, at least a portion of the physical address and the identifier of the cache hit way corresponding to the physical address. If bit cache repair CAM 337 returns a hit, cache controller 121 may retrieve the bit cache repair data from register file 338, at the location identified by the index returned by the CAM hit. In accordance with one or more aspects of the present disclosure, retrieving the cache repair data may be performed in parallel with retrieving the cache data. In an illustrative example, cache repair memory lookup and read operations may be performed in parallel with executing the conventional LLC read pipeline.

Cache controller 120 may be further configured to write bit cache repair data by looking up, in bit cache repair CAM 337, at least a portion of the physical address and the identifier of the cache hit way corresponding to the physical address. If bit cache repair CAM 337 returns a hit, cache controller 121 may store the bit cache repair data in register file 338, at the location identified by the index returned by the CAM hit. In accordance with one or more aspects of the present disclosure, storing the cache repair data may be performed in parallel with storing the cache data. In an illustrative example, cache repair memory lookup and write operations may be performed in parallel with executing the conventional LLC write pipeline.

Figure 4:
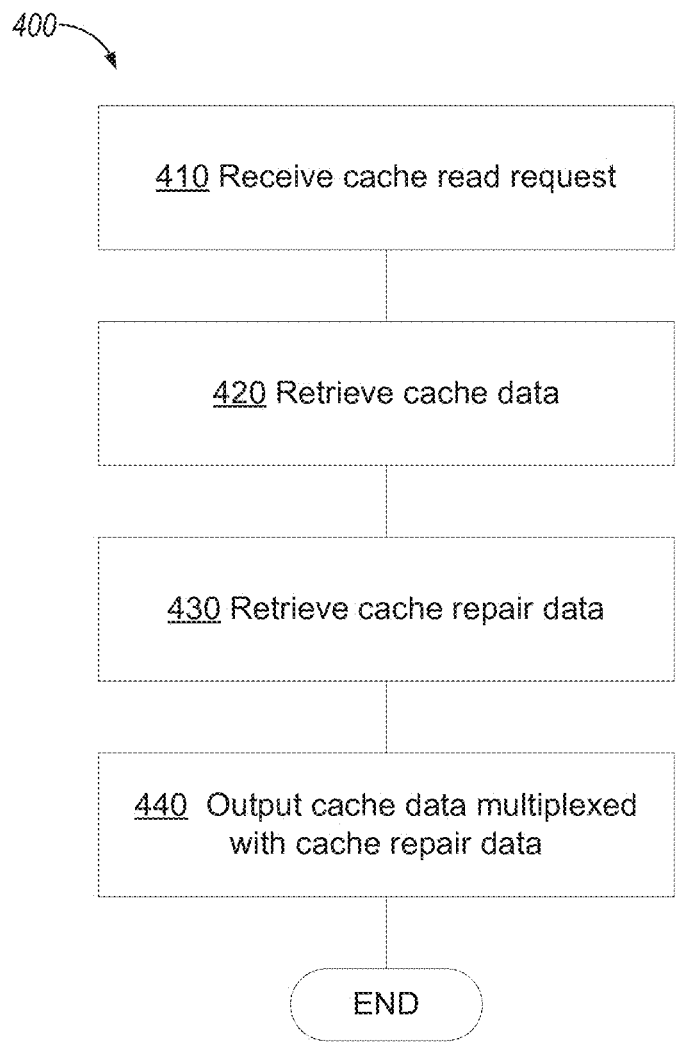
FIG. 4 depicts a flow diagram of an example method implementing the LLC read pipeline, in accordance with one or more aspects of the present disclosure.

FIG. 4 depicts a flow diagram of an example method implementing the LLC read pipeline, in accordance with one or more aspects of the present disclosure. Method 400 may be performed by a computer system that may comprise hardware (e.g., circuitry, dedicated logic, and/or programmable logic), software (e.g., instructions executable on a computer system to perform hardware simulation), or a combination thereof. Method 400 and/or each of its functions, routines, subroutines, or operations may be performed by one or more physical processors of the computer system executing the method. Two or more functions, routines, subroutines, or operations of method 400 may be performed in parallel or in an order which may differ from the order described above. In one example, as illustrated by FIG. 4, method 400 may be performed by the processing systems described herein below and illustrated by FIGS. 6-12.

Referring to FIG. 4, at block 410, the processing system implementing the method may receive a cache read request referencing a physical address.

At block 420, the processing system may retrieve the cache data from a cache location associated with the physical address. The cache location identifier may comprise at least part of the physical address and an identifier of the cache way, as described in more details herein above.

At block 430, the processing system may retrieve, from a cache repair memory, the cache repair data associated with the cache location. The cache repair data may comprise at least one of: a bit repair value, a column repair value, and a raw repair value.

As noted herein above, in certain implementations, each of bit repair memory 131, column repair memory 133, and row repair memory 135 may comprise a first cache repair memory portion to store the cache repair data and a second cache repair memory portion to store identifiers of cache locations for which the cache repair data is stored by the first cache repair memory portion. In various illustrative examples, the first cache repair memory portion is provided by a register file and the second cache repair memory portion is provided by content-addressable memory (CAM).

In certain implementations, retrieving the cache repair data may comprise identifying a register file location by an index of a CAM entry that stores at least part of the physical address and an identifier of the cache way that stores a data item referenced by the physical address. In accordance with one or more aspects of the present disclosure, retrieving the cache repair data may be performed in parallel with retrieving the cache data. In an illustrative example, cache repair memory lookup and read operations may be performed in parallel with executing the conventional LLC read pipeline, e.g., within the three pipeline stages separating the identification of an LLC hit (an LLC tag that is produced by the snoop filter/LLC tag module) and the LLC data becoming available, as described in more details herein above.

At block 440, the processing system may output the cache data multiplexed with the cache repair data, and the method may terminate.

Figure 5:
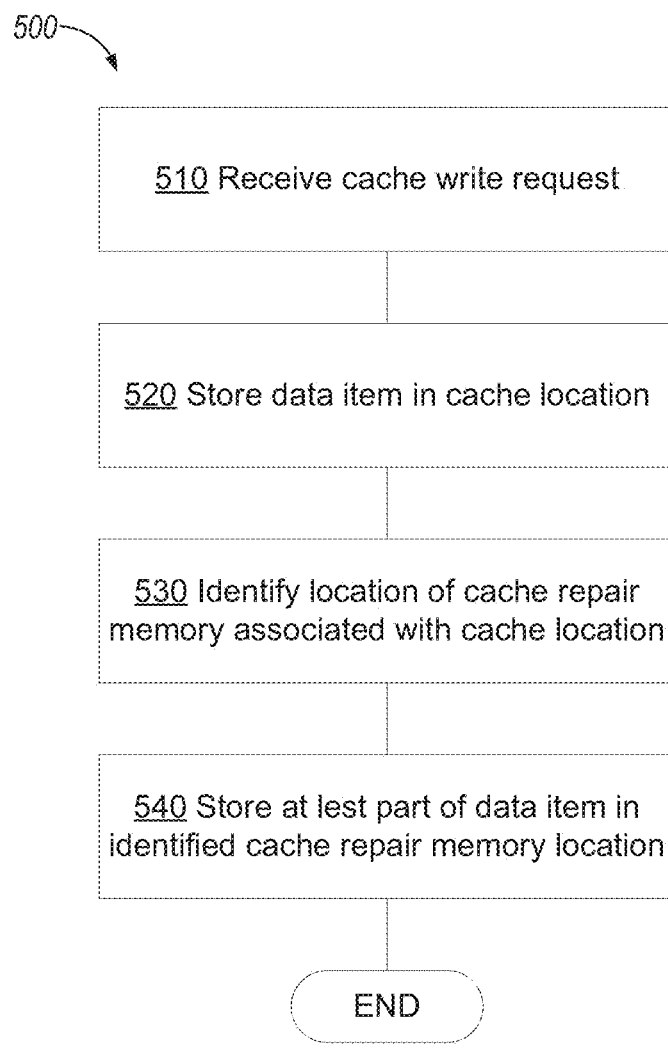
FIG. 5 depicts a flow diagram of an example method implementing the LLC write pipeline, in accordance with one or more aspects of the present disclosure.

FIG. 5 depicts a flow diagram of an example method implementing the LLC write pipeline, in accordance with one or more aspects of the present disclosure. Method 500 may be performed by a computer system that may comprise hardware (e.g., circuitry, dedicated logic, and/or programmable logic), software (e.g., instructions executable on a computer system to perform hardware simulation), or a combination thereof. Method 500 and/or each of its functions, routines, subroutines, or operations may be performed by one or more physical processors of the computer system executing the method. Two or more functions, routines, subroutines, or operations of method 500 may be performed in parallel or in an order which may differ from the order described above. In one example, as illustrated by FIG. 5, method 500 may be performed by the processing systems described herein below and illustrated by FIGS. 6-12.

Referring to FIG. 5, at block 510, the processing system implementing the method may receive a cache write request comprising a data item and a physical address.

At block 520, the processing system may store the data item in a cache location associated with the physical address. The cache location identifier may comprise at least part of the physical address and an identifier of the cache way, as described in more details herein above.

At block 530, the processing system may identify a location of the cache repair memory associated with the cache location. The cache repair data may comprise at least one of: a bit repair value, a column repair value, and a raw repair value. The register file location to store the cache repair data may be identified by an index of a CAM entry that stores at least part of the physical address and an identifier of the cache way that stores a data item referenced by the physical address.

As noted herein above, in certain implementations, each of bit repair memory 131, column repair memory 133, and row repair memory 135 may comprise a first cache repair memory portion to store the cache repair data and a second cache repair memory portion to store identifiers of cache locations for which the cache repair data is stored by the first cache repair memory portion. In various illustrative examples, the first cache repair memory portion is provided by a register file and the second cache repair memory portion is provided by content-addressable memory (CAM).

In certain implementations, storing the cache repair data may comprise identifying a register file location by an index of a CAM entry that stores at least part of the physical address and an identifier of the cache way that stores a data item referenced by the physical address. In accordance with one or more aspects of the present disclosure, storing the cache repair data may be performed in parallel with storing the cache data. In an illustrative example, cache repair memory lookup and write operations may be performed in parallel with executing the conventional LLC write pipeline, as described in more details herein above.

At block 540, the processing system store at least part of the data item in the identified cache repair memory location, and the method may terminate.

The systems and methods described herein perform interrupt delivery to user-level applications. While the description herein references a display controller, the systems and methods described herein may also be used with other functional graphic units. While the description herein references a single protected display session, the systems and methods described herein may also be used to support multiple concurrent protected sessions, based on the number of concurrent overlays supported by the display engine.

Although various systems and methods are described herein with reference to specific integrated circuits, such as processors, other implementations may be applicable to other types of integrated circuits and logic devices. Techniques and teachings of systems and methods described herein may be applied to other types of circuits or semiconductor devices that may also benefit from better energy efficiency and energy conservation. For example, the disclosed implementations are not limited to any particular type of computer systems, and may be also used in other devices, such as handheld devices, systems on chip (SoCs), and embedded applications. Some examples of handheld devices include cellular phones, Internet protocol devices, digital cameras, personal digital assistants (PDAs), and handheld PCs. Embedded applications may include a microcontroller, a digital signal processor (DSP), network computers (NetPC), set-top boxes, network hubs, wide area network (WAN) switches, or any other system that can perform the functions and operations taught below. Moreover, the systems and methods described herein are not limited to physical computing devices, but may also relate to software-implemented methods. Power savings realized by systems and methods described herein may be independent of and complementary to an operating system (OS)-based mechanism, such as the Advanced Configuration and Platform Interface (ACPI) standard.

The methods and systems described herein above may be implemented by computer system of various architectures, designs and configurations for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable to implement the methods described herein. In general, a large variety of systems or electronic devices capable of incorporating a processor and/or other execution logic as disclosed herein are generally suitable for implementing the systems and methods described herein.

Figure 6:
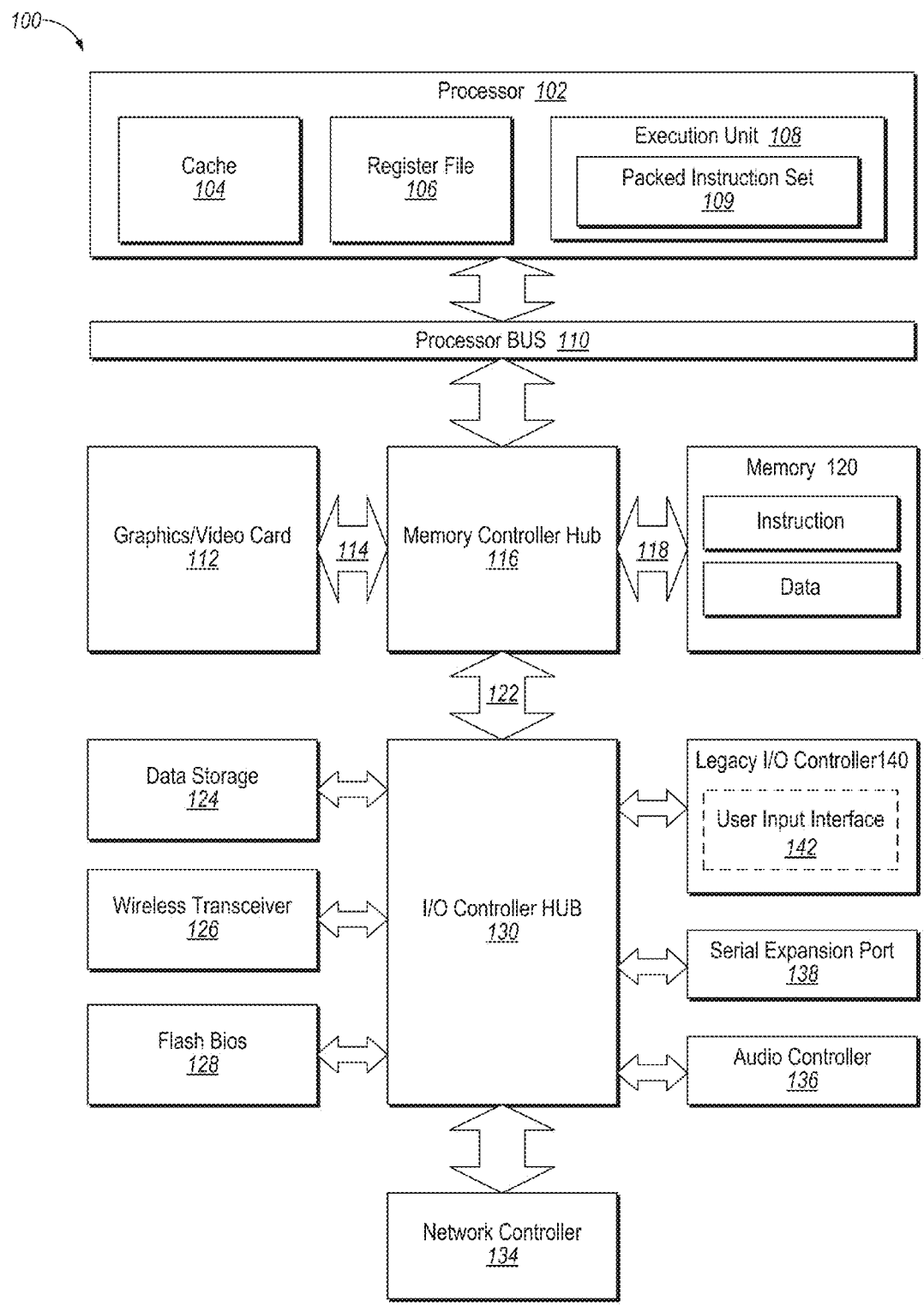
FIG. 6 depicts a high-level component diagram of an example computer system, in accordance with one or more aspects of the present disclosure.

FIG. 6 depicts a high-level component diagram of one example of a computer system in accordance with one or more aspects of the present disclosure. A processing system 100 may include a processor 100 to employ execution units including logic to perform algorithms for process data, in accordance with the present invention, such as in the embodiment described herein. System 100 is representative of processing systems based on the PENTIUM III™, PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

In an illustrative example, processor 102 includes one or more execution units 108 to implement an algorithm that is to perform at least one instruction. One embodiment may be described in the context of a single processor desktop or server system, but alternative embodiments may be included in a multiprocessor system. The processor 102 is coupled to a processor bus 110 that transmits data signals between the processor 102 and other components in the system 100. The elements of system 100 (e.g. graphics accelerator 112, memory controller hub 116, memory 120, I/O controller hub 124, wireless transceiver 126, Flash BIOS 128, Network controller 134, Audio controller 136, Serial expansion port 138, I/O controller 140, etc.) perform their conventional functions that are well known to those familiar with the art.

In certain implementations, the processor 102 includes a Level 1 (L1) internal cache memory 104. Depending on the architecture, the processor 102 may have a single internal cache or multiple levels of internal caches. Other embodiments include a combination of both internal and external caches depending on the particular implementation and needs. Register file 106 is to store different types of data in various registers including integer registers, floating point registers, vector registers, banked registers, shadow registers, checkpoint registers, status registers, and instruction pointer register.

Execution unit 108, including logic to perform integer and floating point operations, also resides in the processor 102. The processor 102, in certain implementations, includes a microcode ROM to store microcode, which when executed, is to perform algorithms for certain macroinstructions or handle complex scenarios. Here, microcode is potentially updateable to handle logic bugs/fixes for processor 102. For one embodiment, execution unit 108 includes logic to handle a packed instruction set 109. By including the packed instruction set 109 in the instruction set of a general-purpose processor 102, along with associated circuitry to execute the instructions, the operations used by many multimedia applications may be performed using packed data in a general-purpose processor 102. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate implementations of an execution unit 108 may also be used in micro controllers, embedded processors, graphics devices, DSPs, and other types of logic circuits. System 100 includes a memory 120. Memory 120 includes a dynamic random access memory (DRAM) device, a static random access memory (SRAM) device, flash memory device, or other memory device. Memory 120 stores instructions and/or data represented by data signals that are to be executed by the processor 102.

A system logic chip 116 is coupled to the processor bus 110 and memory 120. The system logic chip 116 in the illustrated embodiment is a memory controller hub (MCH). The processor 102 can communicate to the MCH 116 via a processor bus 110. The MCH 116 provides a high bandwidth memory path 118 to memory 120 for instruction and data storage and for storage of graphics commands, data and textures. The MCH 116 is to direct data signals between the processor 102, memory 120, and other components in the system 100 and to bridge the data signals between processor bus 110, memory 120, and system I/O 122. In some embodiments, the system logic chip 116 can provide a graphics port for coupling to a graphics controller 112. The MCH 116 is coupled to memory 120 through a memory interface 118. The graphics card 112 is coupled to the MCH 116 through an Accelerated Graphics Port (AGP) interconnect 114.

System 100 uses a proprietary hub interface bus 122 to couple the MCH 116 to the I/O controller hub (ICH) 130. The ICH 130 provides direct connections to some I/O devices via a local I/O bus. The local I/O bus is a high-speed I/O bus for connecting peripherals to the memory 120, chipset, and processor 102. Some examples are the audio controller, firmware hub (flash BIOS) 128, wireless transceiver 126, data storage 124, legacy I/O controller containing user input and keyboard interfaces, a serial expansion port such as Universal Serial Bus (USB), and a network controller 134. The data storage device 124 can comprise a hard disk drive, a floppy disk drive, a CD-ROM device, a flash memory device, or other mass storage device.

Figure 7:
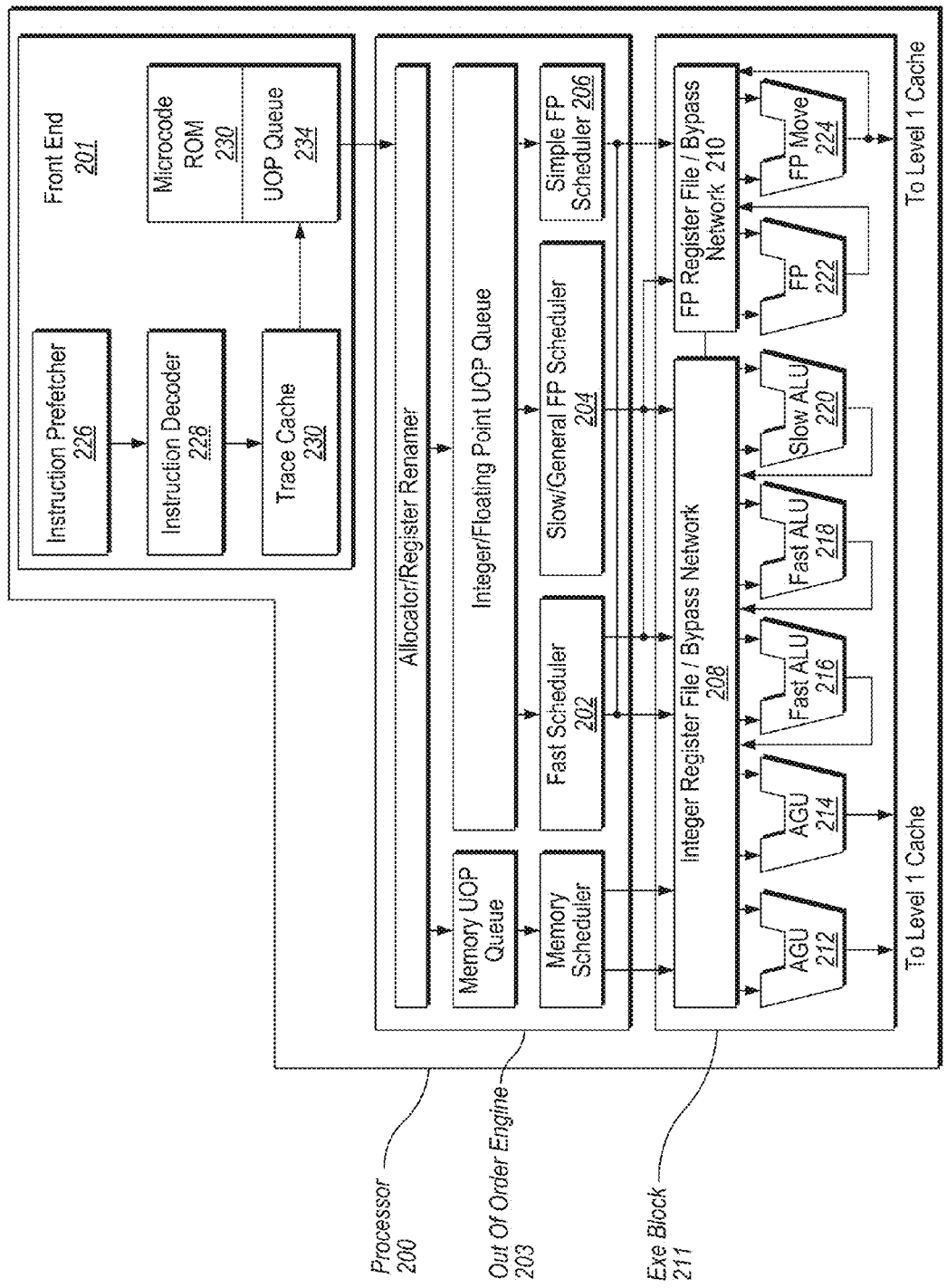
FIG. 7 depicts a block diagram of a processor, in accordance with one or more aspects of the present disclosure.
Figure 8:
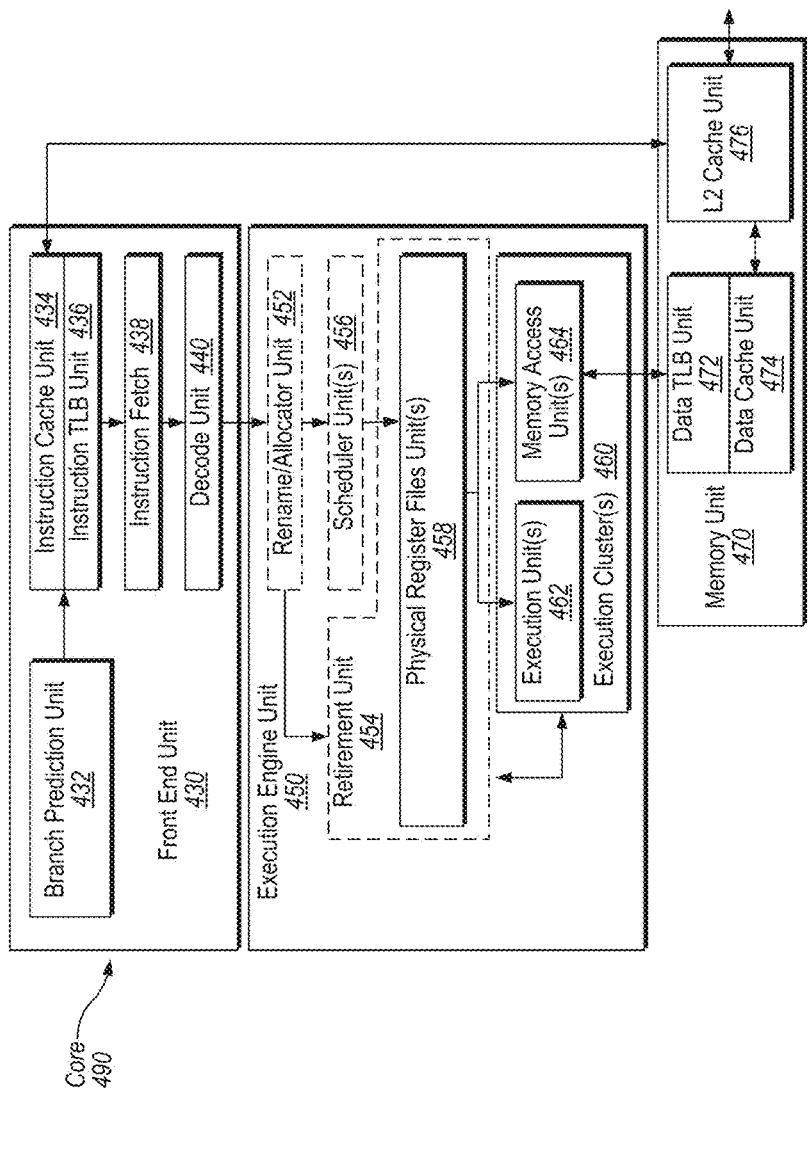
FIGS. 8a-8b schematically illustrate elements of a processor micro-architecture, in accordance with one or more aspects of the present disclosure.

FIG. 7 is a block diagram of the micro-architecture for a processor 200 that includes logic circuits to perform instructions in accordance with one or more aspects of the present disclosure. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 201 is the part of the processor 200 that fetches instructions to be executed and prepares them to be used later in the processor pipeline. The front end 201 may include several units. In one embodiment, the instruction prefetcher 226 fetches instructions from memory and feeds them to an instruction decoder 228 which in turn decodes or interprets them. For example, in certain implementations, the decoder decodes a received instruction into one or more operations called "micro-instructions" or "micro-operations" (also referred to as uops) that the machine can execute. In other embodiments, the decoder parses the instruction into an opcode and corresponding data and control fields that are used by the micro-architecture to perform operations in accordance with one embodiment. In one embodiment, the trace cache 230 takes decoded uops and assembles them into program ordered sequences or traces in the uop queue 234 for execution. When the trace cache 230 encounters a complex instruction, the microcode ROM 232 provides the uops needed to complete the operation.

Some instructions are converted into a single micro-op, whereas others need several micro-ops to complete the full operation. In one embodiment, if more than four micro-ops are needed to complete an instruction, the decoder 228 accesses the microcode ROM 232 to do the instruction. For one embodiment, an instruction can be decoded into a small number of micro ops for processing at the instruction decoder 228. In another embodiment, an instruction can be stored within the microcode ROM 232 should a number of micro-ops be needed to accomplish the operation. The trace cache 230 refers to an entry point programmable logic array (PLA) to determine a correct micro-instruction pointer for reading the micro-code sequences to complete one or more instructions in accordance with one embodiment from the micro-code ROM 232. After the microcode ROM 232 finishes sequencing micro-ops for an instruction, the front end 201 of the machine resumes fetching micro-ops from the trace cache 230.

The out-of-order execution engine 203 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register aliasing logic maps logical registers onto entries in a register file. The allocator also allocates an entry for each uop in one of the two uop queues, one for memory operations and one for non-memory operations, in front of the instruction schedulers: memory scheduler, fast scheduler 202, slow/general floating point scheduler 204, and simple floating point scheduler 206. The uop schedulers 202, 204, 206 determine when a uop is ready to execute based on the readiness of their dependent input register operand sources and the availability of the execution resources the uops need to complete their operation. The fast scheduler 202 of one embodiment can schedule on each half of the main clock cycle while the other schedulers can schedule once per main processor clock cycle. The schedulers arbitrate for the dispatch ports to schedule uops for execution.

Physical register files 208, 210 sit between the schedulers 202, 204, 206, and the execution units 212, 214, 216, 218, 220, 222, 224 in the execution block 211. There is a separate register file 208, 210 for integer and floating point operations, respectively. Each register file 208, 210, of one embodiment also includes a bypass network that can bypass or forward just completed results that have not yet been written into the register file to new dependent uops. The integer register file 208 and the floating point register file 210 are also capable of communicating data with the other. For one embodiment, the integer register file 208 is split into two separate register files, one register file for the low order 32 bits of data and a second register file for the high order 32 bits of data. The floating point register file 210 of one embodiment has 128 bit wide entries because floating point instructions typically have operands from 64 to 128 bits in width.

The execution block 211 contains the execution units 212, 214, 216, 218, 220, 222, 224, where the instructions are actually executed. This section includes the register files 208, 210, that store the integer and floating point data operand values that the micro-instructions need to execute. The processor 200 of one embodiment is comprised of a number of execution units: address generation unit (AGU) 212, AGU 214, fast ALU 216, fast ALU 218, slow ALU 220, floating point ALU 222, floating point move unit 224. For one embodiment, the floating point execution blocks 222, 224, execute floating point, MMX, SIMD, and SSE, or other operations. The floating point ALU 222 of one embodiment includes a 64 bit by 64 bit floating point divider to execute divide, square root, and remainder micro-ops. For systems and methods described herein, instructions involving a floating point value may be handled with the floating point hardware. In one embodiment, the ALU operations go to the high-speed ALU execution units 216, 218. The fast ALUs 216, 218, of one embodiment can execute fast operations with an effective latency of half a clock cycle. For one embodiment, most complex integer operations go to the slow ALU 220 as the slow ALU 220 includes integer execution hardware for long latency type of operations, such as a multiplier, shifts, flag logic, and branch processing. Memory load/store operations are executed by the AGUs 212, 214. For one embodiment, the integer ALUs 216, 218, 220 are described in the context of performing integer operations on 64 bit data operands. In alternative embodiments, the ALUs 216, 218, 220 can be implemented to support a variety of data bits including 16, 32, 128, 256, etc. Similarly, the floating point units 222, 224 can be implemented to support a range of operands having bits of various widths. For one embodiment, the floating point units 222, 224 can operate on 128 bits wide packed data operands in conjunction with SIMD and multimedia instructions.

In one embodiment, the uops schedulers 202, 204, 206 dispatch dependent operations before the parent load has finished executing. As uops are speculatively scheduled and executed in processor 200, the processor 200 also includes logic to handle memory misses. If a data load misses in the data cache, there can be dependent operations in flight in the pipeline that have left the scheduler with temporarily incorrect data. A replay mechanism tracks and re-executes instructions that use incorrect data. The dependent operations should be replayed and the independent ones are allowed to complete. The schedulers and replay mechanism of one embodiment of a processor are also designed to catch instruction sequences for text string comparison operations.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register aliasing, combinations of dedicated and dynamically allocated physical registers, etc. In one embodiment, integer registers store thirty-two bit integer data. A register file of one embodiment also contains eight multimedia SIMD registers for packed data. For the discussions below, the registers are understood to be data registers designed to hold packed data, such as 64 bits wide MMX registers (also referred to as 'mm' registers in some instances) in microprocessors enabled with the MMX™ technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

FIGS. 8a-8b schematically illustrate elements of a processor micro-architecture, in accordance with one or more aspects of the present disclosure. In FIG. 8a, a processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

In FIG. 8b, arrows denote a coupling between two or more units and the direction of the arrow indicates a direction of data flow between those units. FIG. 8b shows processor core 111 including a front end unit 430 coupled to an execution engine unit 450, and both are coupled to a memory unit 470.

The core 111 may be a reduced instruction set computing (RISC) core, a complex instruction set computing (CISC) core, a very long instruction word (VLIW) core, or a hybrid or alternative core type. As yet another option, the core 111 may be a special-purpose core, such as, for example, a network or communication core, compression engine, graphics core, or the like.

The front end unit 430 includes a branch prediction unit 432 coupled to an instruction cache unit 434, which is coupled to an instruction translation lookaside buffer (TLB) 436, which is coupled to an instruction fetch unit 438, which is coupled to a decode unit 440. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 434 is further coupled to a level 2 (L2) cache unit 476 in the memory unit 470. The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservations stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 458 is overlapped by the retirement unit 454 to illustrate various ways in which register aliasing and out-of-order execution may be implemented (e.g., using a reorder buffer(s) and a retirement register file(s), using a future file(s), a history buffer(s), and a retirement register file(s); using a register maps and a pool of registers; etc.). Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register aliasing, combinations of dedicated and dynamically allocated physical registers, etc. The retirement unit 454 and the physical register file(s) unit(s) 458 are coupled to the execution cluster(s) 460. The execution cluster(s) 460 includes a set of one or more execution units 162 and a set of one or more memory access units 464. The execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. In one exemplary embodiment, the memory access units 464 may include a load unit, a store address unit, and a store data unit, each of which is coupled to the data TLB unit 472 in the memory unit 470. The L2 cache unit 476 is coupled to one or more other levels of cache and eventually to a main memory.

By way of example, the exemplary register aliasing, out-of-order issue/execution core architecture may implement the pipeline 400 as follows: the instruction fetch 438 performs the fetch and length decoding stages 402 and 404; the decode unit 440 performs the decode stage 406; the rename/allocator unit 452 performs the allocation stage 408 and renaming stage 410; the scheduler unit(s) 456 performs the schedule stage 412; the physical register file(s) unit(s) 458 and the memory unit 470 perform the register read/memory read stage 414; the execution cluster 460 perform the execute stage 416; the memory unit 470 and the physical register file(s) unit(s) 458 perform the write back/memory write stage 418; various units may be involved in the exception handling stage 422; and the retirement unit 454 and the physical register file(s) unit(s) 458 perform the commit stage 424.

The core 111 may support one or more instructions sets (e.g., the x86 instruction set (with some extensions that have been added with newer versions); the MIPS instruction set of MIPS Technologies of Sunnyvale, Calif.; the ARM instruction set (with additional extensions such as NEON) of ARM Holdings of Sunnyvale, Calif.).

In certain implementations, the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register aliasing is described in the context of out-of-order execution, it should be understood that register aliasing may be used in an in-order architecture. While the illustrated embodiment of the processor also includes a separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

In certain implementations, processor core 111 may be designed as an out-of-order (OOO) core in order to improve the performance by executing instructions as soon as their operands become available, rather than in the program order. However, the performance benefit may be offset by a considerable increase in the power consumption. When multiple execution threads are available for the operating system to schedule, employing multiple in-order cores rather than large OOO cores may improve the energy consumption profile of the processor without compromising the overall performance. Thus, to improve the performance and energy consumption scalability of a processor, the latter may be designed to support a variable number of cores depending on the performance needs and the number of threads available to the operating system for scheduling.

Figure 9:
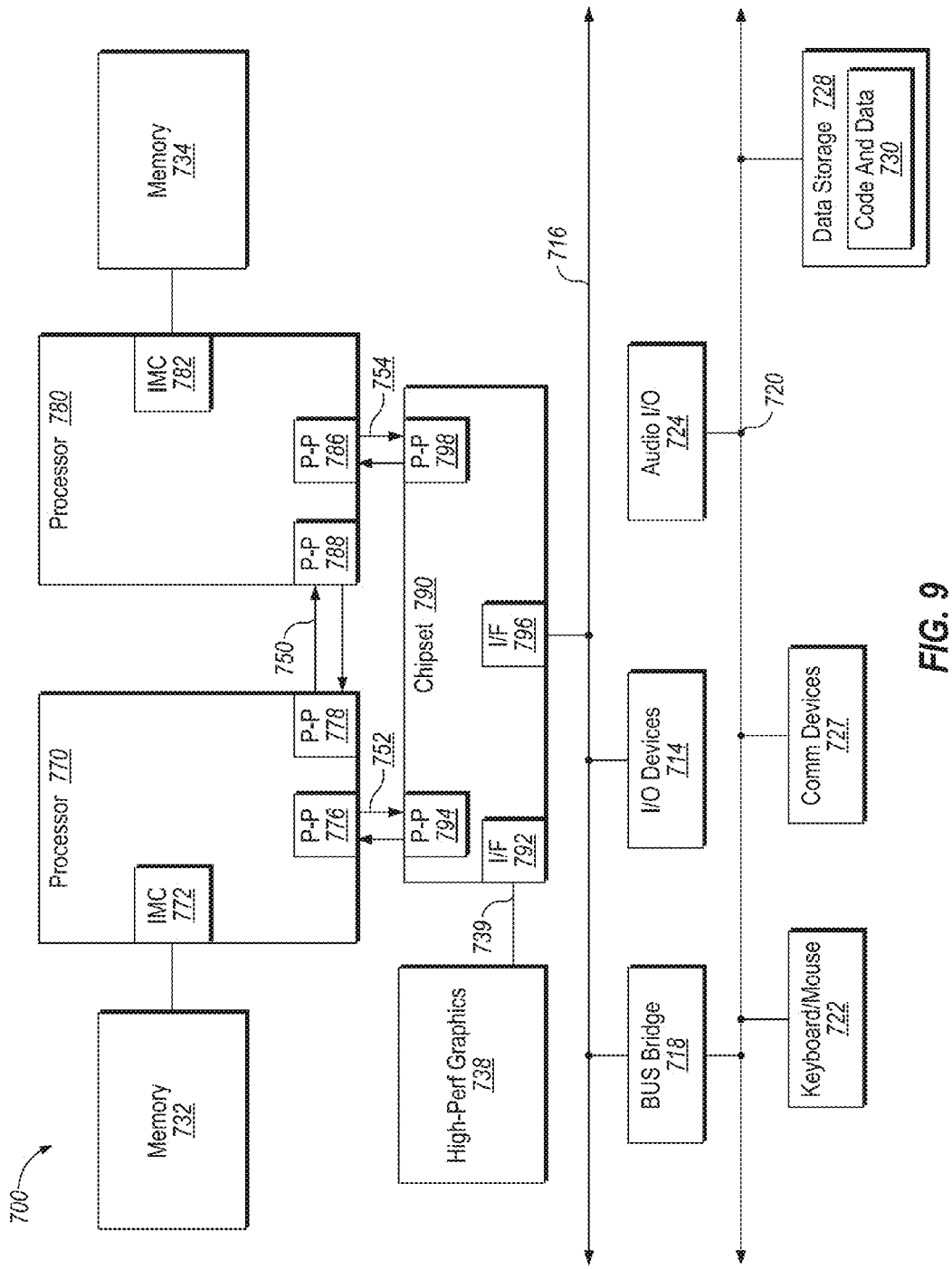
FIG. 9 depicts a block diagram of an example computer system, in accordance with one or more aspects of the present disclosure.

FIG. 9 depicts a block diagram of an example computer system 700, in accordance with one or more aspects of the present disclosure. As shown in FIG. 9, multiprocessor system 700 is a point-to-point interconnect system, and includes a first processor 770 and a second processor 780 coupled via a point-to-point interconnect 750. Each of processors 770 and 780 may be some version of processing system 100 capable of implementing virtual machine-based protected video paths, as described in more details herein above. While shown with only two processors 770, 780, it is to be understood that the scope of the present disclosure is not so limited. In other embodiments, one or more additional processors may be present in the example computer system.

Processors 770 and 780 are shown including integrated memory controller units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 9, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present disclosure is not so limited.

As shown in FIG. 9, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720.

Figure 10:
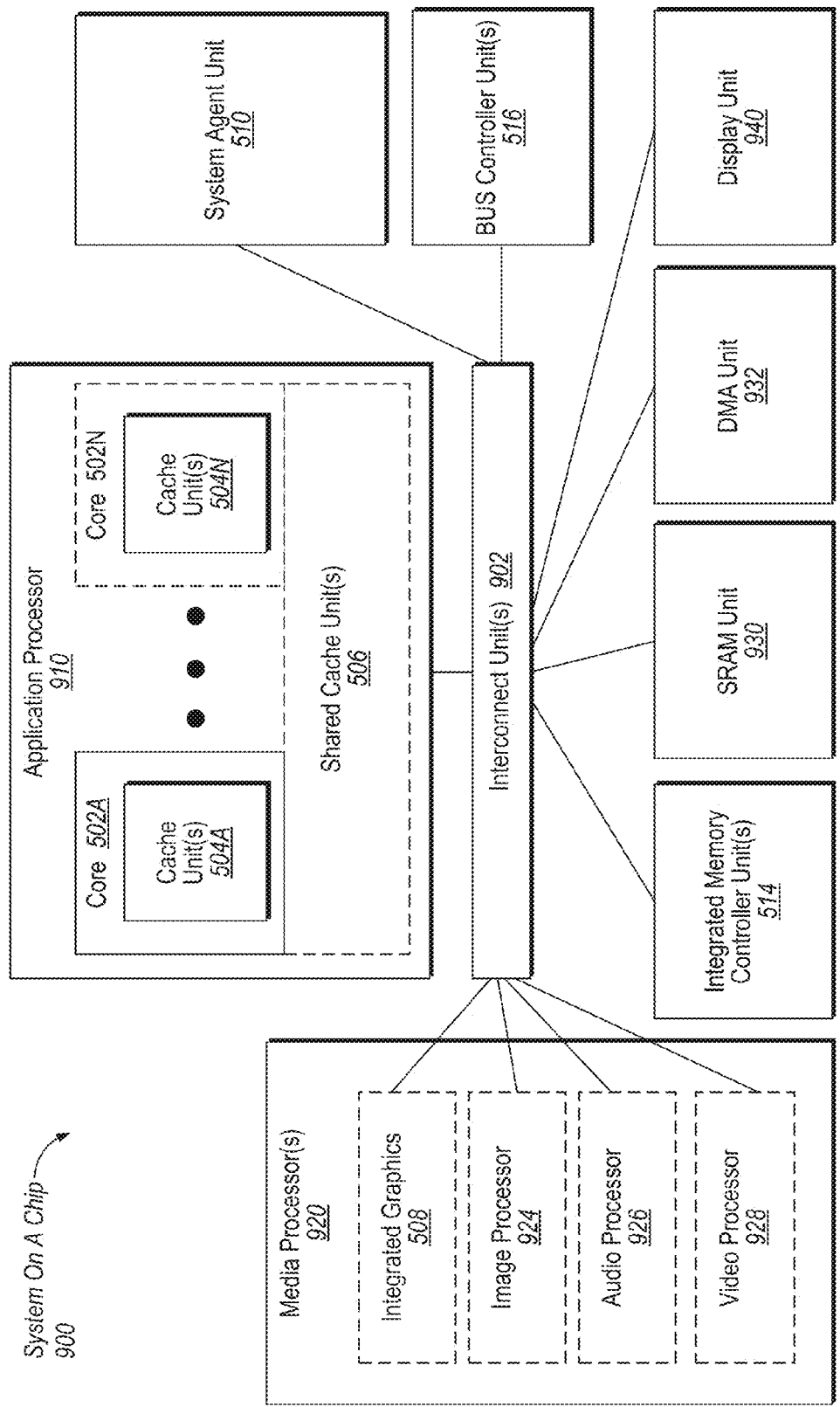
FIG. 10 depicts a block diagram of an example system on a chip (SoC), in accordance with one or more aspects of the present disclosure.

FIG. 10 depicts a block diagram of an example system on a chip (SoC) 900, in accordance with one or more aspects of the present disclosure. The application processor 910 provided by some version of processing system 100 capable of implementing virtual machine-based protected video paths, as described in more details herein above. As schematically illustrated by FIG. 10, interconnect unit(s) 902 may be coupled to: an application processor 910 which includes a set of one or more cores 902A-N and shared cache unit(s) 906; a system agent unit 910; a bus controller unit(s) 916; an integrated memory controller unit(s) 914; a set or one or more media processors 920 which may include integrated graphics logic 908, an image processor 924 for providing still and/or video camera functionality, an audio processor 926 for providing hardware audio acceleration, and a video processor 928 for providing video encode/decode acceleration; an static random access memory (SRAM) unit 930; a direct memory access (DMA) unit 932; and a display unit 940 for coupling to one or more external displays.

Figure 11:
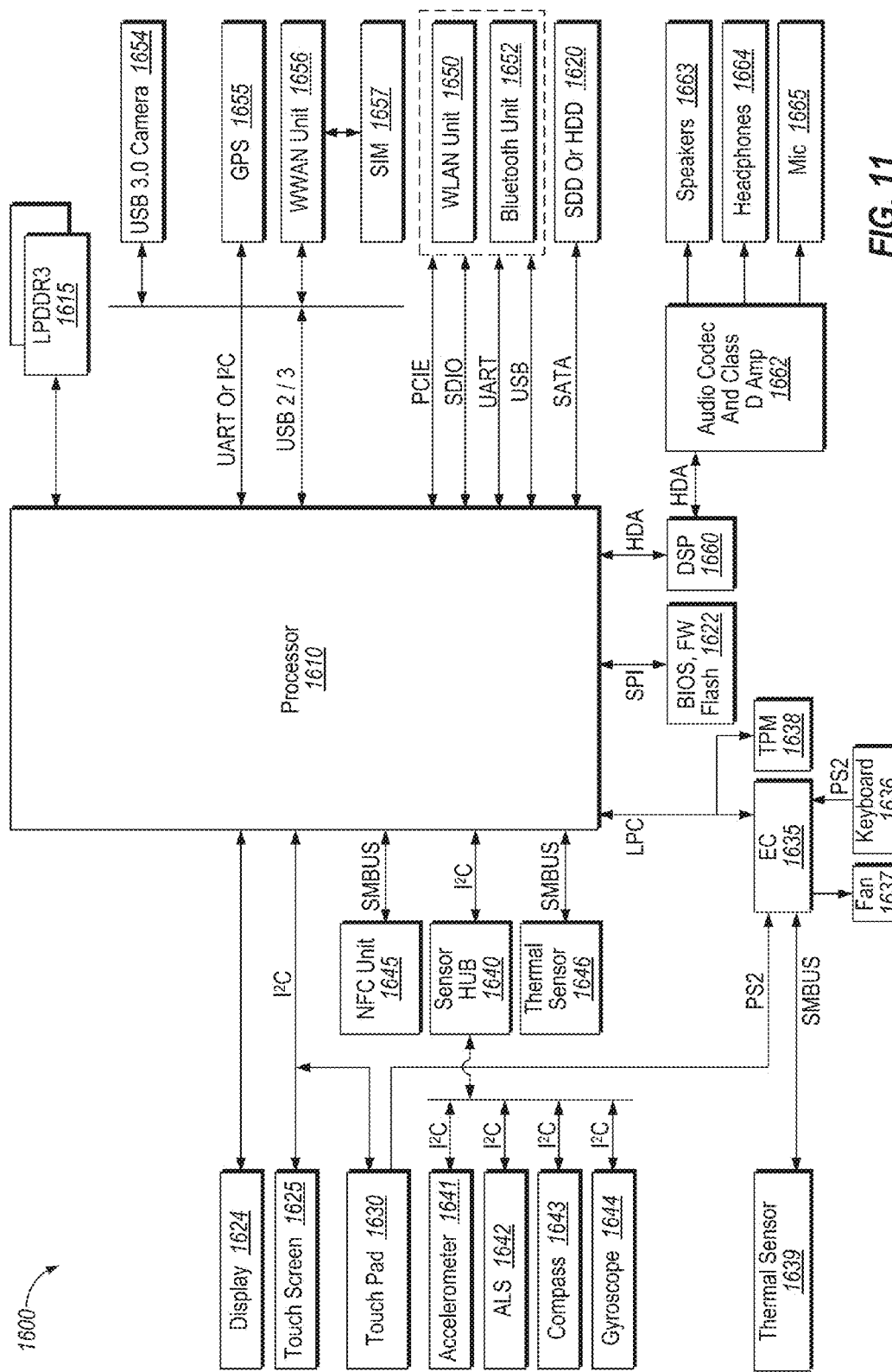
FIG. 11 depicts a block diagram of an example computer system, in accordance with one or more aspects of the present disclosure.

FIG. 11 depicts a block diagram of an example computer system, in accordance with one or more aspects of the present disclosure. Processor 1610 may be provided by some version of processing system 100 capable of implementing virtual machine-based protected video paths, as described in more details herein above.

The system 1600 schematically illustrated by FIG. 11 may include any combination of components implemented as ICs, portions thereof, discrete electronic devices, or other modules, logic, hardware, software, firmware, or a combination thereof adapted in a computer system, or as components otherwise incorporated within a chassis of the computer system. The block diagram of FIG. 11 is intended to show a high level view of many components of the computer system. However, it is to be understood that some of the components shown may be omitted, additional components may be present, and different arrangement of the components shown may occur in other implementations.

Processor 1610 may be provided by a microprocessor, multi-core processor, multithreaded processor, an ultra low voltage processor, an embedded processor, or other known processing element. In the illustrated implementation, processor 1610 acts as a main processing unit and central hub for communication with many of the various components of the system 1600. As one example, processor 1600 may be implemented as a system on a chip (SoC). As a specific illustrative example, processor 1610 includes an Intel® Architecture Core™-based processor such as an i3, i5, i7 or another such processor available from Intel Corporation, Santa Clara, Calif.

Processor 1610 may communicate with a system memory 1615. In various implementations the individual memory devices may be of different package types such as single die package (SDP), dual die package (DDP) or quad die package (1P). These devices, in some implementations, may be directly soldered onto a motherboard to provide a lower profile solution, while in other implementations the devices may be configured as one or more memory modules that in turn couple to the motherboard by a given connector. Other memory implementations are possible, such as other types of memory modules, e.g., dual inline memory modules (DIMMs) of different varieties including but not limited to microDIMMs, MiniDIMMs. In one illustrative example, the memory may be sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 1620 may be also coupled to processor 1610. In certain implementations, to enable a thinner and lighter system design as well as to improve system responsiveness, the mass storage 1620 may be implemented via a SSD. In other implementations, the mass storage may primarily be provided by a hard disk drive (HDD) with a smaller amount of SSD storage to act as a SSD cache to enable non-volatile storage of context state and other such information during power down events so that a fast power up can occur on re-initiation of system activities.

Also shown in FIG. 11, a flash device 1622 may be coupled to processor 1610, e.g., via a serial peripheral interface (SPI). The flash device 1622 may provide for non-volatile storage of system software, including a basic input/output software (BIOS) as well as other firmware of the system.

In various implementations, the mass storage of the system may be provided by a SSD alone or as a disk, optical or other drive with an SSD cache. In some implementations, the mass storage may be provided by an SSD or as a HDD along with a restore (RST) cache module. The SSD cache may be configured as a single level cache (SLC) or multi-level cache (MLC) option to provide an appropriate level of responsiveness.

Various input/output (IO) devices may be present within system 1600, including, e.g., a display 1624 which may be provided by a high definition LCD or LED panel configured within a lid portion of the chassis. This display panel may also provide for a touch screen 1625 adapted externally over the display panel such that via a user's interaction with this touch screen, user inputs can be provided to the system to enable desired operations, e.g., with regard to the display of information, accessing of information and so forth. In certain implementations, display 1624 may be coupled to processor 1610 via a display interconnect that can be implemented as a high performance graphics interconnect. Touch screen 1625 may be coupled to processor 1610 via another interconnect, which in an embodiment can be an I2C interconnect. In addition to touch screen 1625, user input by way of touch can also occur via a touch pad 1630 which may be configured within the chassis and may also be coupled to the same I2C interconnect as touch screen 1625.

Various sensors may be present within the system and may be coupled to processor 1610 in different manners. Certain inertial and environmental sensors may couple to processor 1610 through a sensor hub 1640, e.g., via an I2C interconnect. These sensors may include an accelerometer 1641, an ambient light sensor (ALS) 1642, a compass 1643 and a gyroscope 1644. Other environmental sensors may include one or more thermal sensors 1646 which in some embodiments couple to processor 1610 via a system management bus (SMBus) bus. In certain implementations, one or more infrared or other heat sensing elements, or any other element for sensing the presence or movement of a user may be present.

Various peripheral devices may couple to processor 1610 via a low pin count (LPC) interconnect. In certain implementations, various components can be coupled through an embedded controller 1635. Such components can include a keyboard 1636 (e.g., coupled via a PS2 interface), a fan 1637, and a thermal sensor 1639. In some embodiments, touch pad 1630 may also couple to EC 1635 via a PS2 interface. In addition, a security processor such as a trusted platform module (TPM) 1638 in accordance with the Trusted Computing Group (TCG) TPM Specification Version 1.2, dated Oct. 2, 2003, may also couple to processor 1610 via this LPC interconnect.

In certain implementations, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 1600 can communicate with external devices in a variety of manners, including wirelessly. In the embodiment shown in FIG. 16, various wireless modules, each of which can correspond to a radio configured for a particular wireless communication protocol, are present. One manner for wireless communication in a short range such as a near field may be via a near field communication (NFC) unit 1645 which may communicate, in one embodiment with processor 1610 via an SMBus.

Additional wireless units can include other short range wireless engines including a WLAN unit 1650 and a Bluetooth unit 1652. Using WLAN unit 1650, Wi-Fi™ communications in accordance with a given Institute of Electrical and Electronics Engineers (IEEE) 802.11 standard can be realized, while via Bluetooth unit 1652, short range communications via a Bluetooth protocol can occur. These units may communicate with processor 1610 via, e.g., a USB link or a universal asynchronous receiver transmitter (UART) link. Or these units may couple to processor 1610 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 1656 which in turn may couple to a subscriber identity module (SIM) 1657. In addition, to enable receipt and use of location information, a GPS module 1655 may also be present.

To provide for audio inputs and outputs, an audio processor can be implemented via a digital signal processor (DSP) 1660, which may couple to processor 1610 via a high definition audio (HDA) link. Similarly, DSP 1660 may communicate with an integrated coder/decoder (CODEC) and amplifier 1662 that in turn may couple to output speakers 1663 which may be implemented within the chassis. Similarly, amplifier and CODEC 1662 can be coupled to receive audio inputs from a microphone 1665.

Figure 12:
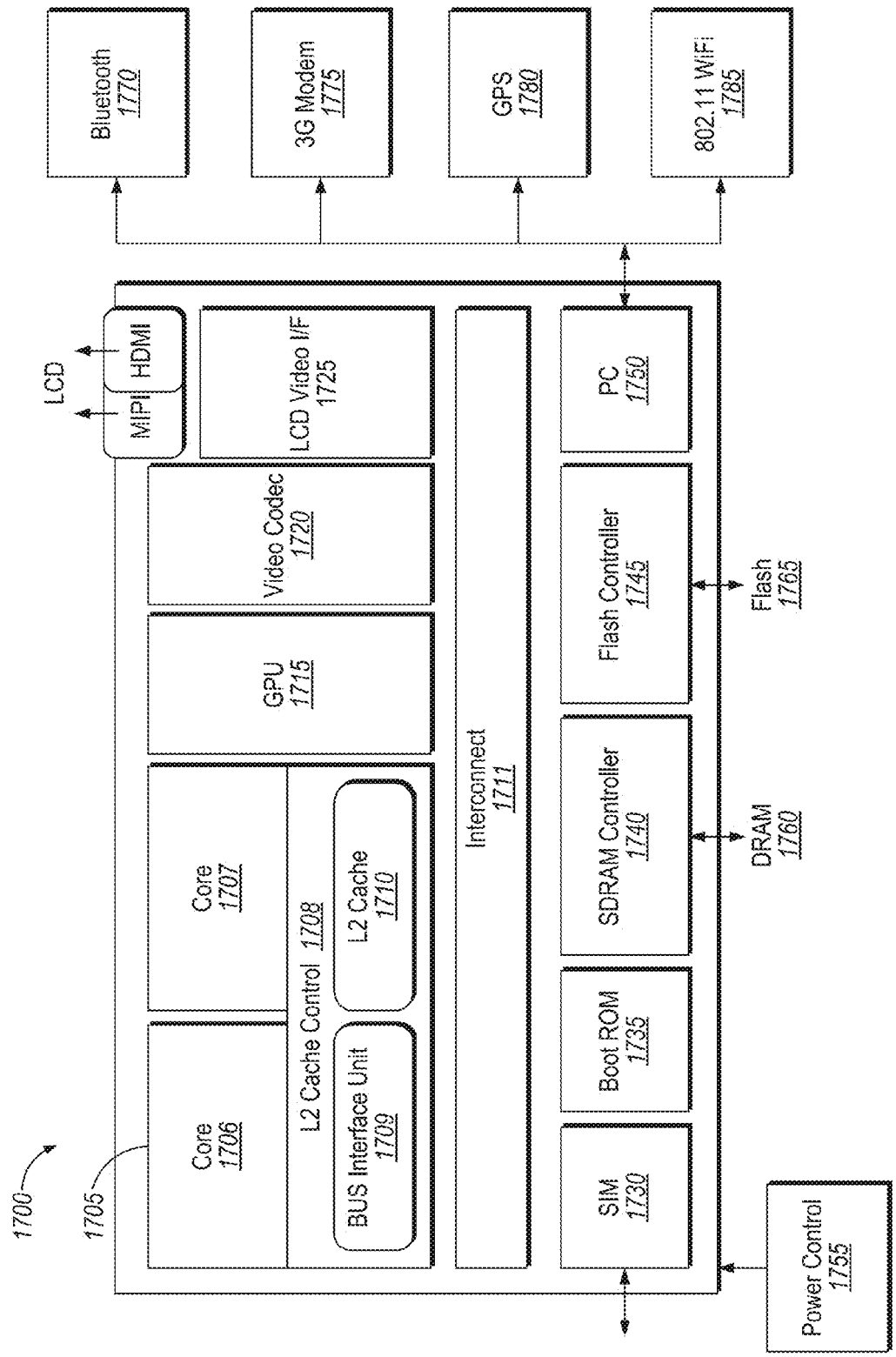
FIG. 12 depicts a block diagram of an example system on a chip (SoC), in accordance with one or more aspects of the present disclosure.

FIG. 12 depicts a block diagram of an example system on a chip (SoC), in accordance with one or more aspects of the present disclosure. As a specific illustrative example, SOC 1700 may be included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

As schematically illustrated by FIG. 12, SOC 1700 may include two cores. Cores 1706 and 1707 may be coupled to cache control 1708 that is associated with bus interface unit 1709 and L2 cache 1710 to communicate with other parts of system 1700. Interconnect 1710 may include an on-chip interconnect, such as an IOSF, AMBA, or other interconnect.

Interface 1710 may provide communication channels to the other components, such as a Subscriber Identity Module (SIM) 1730 to interface with a SIM card, a boot ROM 1735 to hold boot code for execution by cores 1706 and 1707 to initialize and boot SOC 1700, a SDRAM controller 1740 to interface with external memory (e.g., DRAM 1760), a flash controller 1745 to interface with non-volatile memory (e.g., flash 1765), a peripheral control 1550 (e.g., Serial Peripheral Interface) to interface with peripherals, video codecs 1720 and Video interface 1725 to display and receive input (e.g., touch enabled input), GPU 1715 to perform graphics related computations, etc. In addition, the system may comprise peripherals for communication, such as a Bluetooth module 1770, 3G modem 1775, GPS 1785, and WiFi 1785.

Other computer system designs and configurations may also be suitable to implement the systems and methods described herein. The following examples illustrate various implementations in accordance with one or more aspects of the present disclosure.

Example 1 is a processing system, comprising: a processing core communicatively coupled to a cache via a cache controller; a cache repair memory communicatively coupled to the cache controller; wherein the cache controller is configured, responsive to receiving a read request referencing a physical address, to: retrieve cache data from a cache location identified by the physical address, retrieve, in parallel with retrieving the cache data, cache repair data from the cache repair memory, the cache repair data associated with the cache location, the cache repair data comprising at least one of: a bit repair value, a column repair value, and a raw repair value, and output the cache data multiplexed with the cache repair data.

Example 2 is a processing system, comprising: a processing core communicatively coupled to a cache via a cache controller; a cache repair memory communicatively coupled to the cache controller; wherein the cache controller comprises a processing means that is configured, responsive to receiving a read request referencing a physical address, to: retrieve cache data from a cache location identified by the physical address, retrieve, in parallel with retrieving the cache data, cache repair data from the cache repair memory, the cache repair data associated with the cache location, the cache repair data comprising at least one of: a bit repair value, a column repair value, and a raw repair value, and output the cache data multiplexed with the cache repair data.

In Example 3, the cache controller of the processing system of any of Examples 1-2 is configured to retrieve the cache repair data within two or more pipeline stages separating identification of an LLC hit and availability of the cache data.

In Example 4, the cache controller of the processing system of any of Examples 1-3 comprises a cache repair memory initialization logic configured to initialize the cache repair memory by reading a programmable circuit associated with the cache.

In Example 5, the cache repair memory of the processing system of any of Examples 1-4 comprises a first cache repair memory portion to store the cache repair data and a second cache repair memory portion to store identifiers of cache locations for which the cache repair data is stored by the first cache repair memory portion.

In Example 6, the first cache repair memory portion of the processing system of Example 5 is provided by a register file.

In Example 7, the second cache repair memory portion of the processing system of Example 5 is provided by a content-addressable memory.

Example 8 is the processing system of any of Examples 5-7, wherein an identifier of a cache location comprises at least one of: at least part of the physical address and an identifier of a cache way that stores a data item referenced by the physical address.

In Example 9, the cache controller of the processing system of any of Examples 5-8 is configured to retrieve the cache repair data from a location of the first cache repair memory portion, the location identified by an index of an entry of the second cache repair memory portion storing at least one of: at least part of the physical address and an identifier of a cache way that stores a data item referenced by the physical address.

In Example 10, the cache controller of the processing system of any of Examples 5-9 is further configured, responsive to receiving a write request comprising a data item and a second physical address, to: store the data item in a cache location identified by the second physical address, store at least part of the data item in a location of the first cache repair memory portion, the location identified by an index of an entry of the second cache repair memory portion storing at least one of: at least part of the second physical address and an identifier of a cache way that stores a data item referenced by the second physical address.

In Example 11, the cache controller of the processing system of any of Examples 1-10 comprises a first multiplexer coupled to the cache repair memory, the first multiplexer configured to output at least one of: the bit repair value associated with cache location, the column repair value associated with cache location, and the raw repair value associated with cache location.

In Example 12, the cache controller of the processing system of Example 11 comprises a second multiplexer coupled to the first multiplexer and to the cache, the second multiplexer configured to output the cache data multiplexed with the cache repair data.

Example 13 is a method, comprising: receiving, by a processing system, a cache read request referencing a physical address; retrieving cache data from a cache location identified by the physical address; retrieving, in parallel with retrieving the cache data, cache repair data from a cache repair memory, the cache repair data associated with the cache location, the cache repair data comprising at least one of: a bit repair value, a column repair value, and a raw repair value; and outputting the cache data multiplexed with the cache repair data.

Example 14 is the method of Example 13, wherein retrieving the cache repair data is performed within two or more pipeline stages separating identification of an LLC hit and availability of the cache data.

Example 15 is the method of any of Examples 13-14, further comprising: initializing the cache repair memory by reading a programmable circuit associated with the cache.

Example 16 is the method of any of Examples 13-15, wherein the cache repair memory comprises a first cache repair memory portion to store the cache repair data and a second cache repair memory portion to store identifiers of cache locations for which the cache repair data is stored by the first cache repair memory portion.

Example 17 is the method of Example 16, wherein the first cache repair memory portion is provided by a register file and the second cache repair memory portion is provided by a content-addressable memory.

Example 18 is the method of Example 16, wherein an identifier of a cache location comprises at least one of: at least part of the physical address and an identifier of a cache way that stores a data item referenced by the physical address.

Example 19 is the method of any of Examples 13-18, wherein retrieving the cache repair data comprises identifying a location of the first cache repair memory portion by an index of an entry of the second cache repair memory portion storing at least one of: at least part of the physical address and an identifier of a cache way that stores a data item referenced by the physical address.

Example 20 is the method of any of Examples 13-19, further comprising: receiving a write request comprising a data item and a second physical address; storing the data item in a cache location identified by the second physical address, store at least part of the data item in a location of the first cache repair memory portion, the location identified by an index of an entry of the second cache repair memory portion storing at least one of: at least part of the second physical address and an identifier of a cache way that stores a data item referenced by the second physical address.

Example 21 is system-on-chip (SoC), comprising: a system memory; a cache to store contents of at least a subset of the system memory in the cache; a cache controller communicatively coupled to the cache; a cache repair memory communicatively coupled to the cache controller; a processing core communicatively coupled to the memory and to the cache controller; wherein the cache controller is configured, responsive to receiving a read request referencing a physical address, to: retrieve cache data from a cache location identified by the physical address, retrieve, in parallel with retrieving the cache data, cache repair data from the cache repair memory, the cache repair data associated with the cache location, the cache repair data comprising at least one of: a bit repair value, a column repair value, and a raw repair value, and output the cache data multiplexed with the cache repair data.

Example 22 is an apparatus comprising: a memory; and a processing system coupled to the memory, the processing system to perform the method of any of the Examples 13-20.

Example 23 is a computer-readable non-transitory storage medium comprising executable instructions that, when executed by a processing system, cause the processing system to perform the method of any of Examples 13-20.

Example 24 is a computer-readable non-transitory storage medium comprising executable instructions that, when executed by a processing system, cause the processing system to: receive a cache read request referencing a physical address; retrieve cache data from a cache location identified by the physical address; retrieve, in parallel with retrieving the cache data, cache repair data from a cache repair memory, the cache repair data associated with the cache location, the cache repair data comprising at least one of: a bit repair value, a column repair value, and a raw repair value; and output the cache data multiplexed with the cache repair data.

Example 25 is the computer-readable non-transitory storage medium of Example 24, wherein retrieving the cache repair data is performed within two or more pipeline stages separating identification of an LLC hit and availability of the cache data.

Example 26 is the computer-readable non-transitory storage medium of any of Examples 24-25, further comprising executable instructions causing the processing system to: initialize the cache repair memory by reading a programmable circuit associated with the cache.

Example 27 is the computer-readable non-transitory storage medium of any of Examples 24-26, wherein the cache repair memory comprises a first cache repair memory portion to store the cache repair data and a second cache repair memory portion to store identifiers of cache locations for which the cache repair data is stored by the first cache repair memory portion.

Example 28 is the computer-readable non-transitory storage medium of Example 27, wherein the first cache repair memory portion is provided by a register file and the second cache repair memory portion is provided by a content-addressable memory.

Example 29 is the computer-readable non-transitory storage medium of Example 27, wherein an identifier of a cache location comprises at least one of: at least part of the physical address and an identifier of a cache way that stores a data item referenced by the physical address.

Example 30 is the computer-readable non-transitory storage medium of any of Examples 24-29, wherein retrieving the cache repair data comprises identifying a location of the first cache repair memory portion by an index of an entry of the second cache repair memory portion storing at least one of: at least part of the physical address and an identifier of a cache way that stores a data item referenced by the physical address.

Example 31 is the computer-readable non-transitory storage medium of any of Examples 24-30, further comprising executable instructions causing the processing system to: receive a write request comprising a data item and a second physical address; store the data item in a cache location identified by the second physical address; store at least part of the data item in a location of the first cache repair memory portion, the location identified by an index of an entry of the second cache repair memory portion storing at least one of: at least part of the second physical address and an identifier of a cache way that stores a data item referenced by the second physical address.

Some content portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method operations. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

The invention claimed is:

1. A processing system, comprising:
a processing core communicatively coupled to a cache via a cache controller;
a cache repair memory communicatively coupled to the cache controller;
wherein the cache controller is configured, responsive to receiving a read request referencing a physical address, to:
retrieve cache data from a cache location identified by the physical address,
retrieve, from the cache repair memory a bit repair value associated with a specific bit of the cache location, a column repair value associated with a specific column of the cache location, and a row repair value associated with the a specific row of cache location,
produce cache repair data by multiplexing the bit repair value, the column repair value, and the row repair value, and
output the cache data multiplexed with the cache repair data.

2. The processing system of claim 1, wherein the cache controller is configured to retrieve the cache repair data within two or more pipeline stages separating identification of an LLC hit and availability of the cache data.

3. The processing system of claim 1, wherein the cache controller comprises a cache repair memory initialization logic configured to initialize the cache repair memory by reading a programmable circuit associated with the cache.

4. The processing system of claim 1, wherein the cache repair memory comprises a first cache repair memory portion to store the cache repair data and a second cache repair memory portion to store identifiers of cache locations for which the cache repair data is stored by the first cache repair memory portion.

5. The processing system of claim 4, wherein the first cache repair memory portion is provided by a register file.

6. The processing system of claim 4, wherein the second cache repair memory portion is provided by a content-addressable memory.

7. The processing system of claim 4, wherein an identifier of a cache location comprises at least one of: at least part of the physical address and an identifier of a cache way that stores a data item referenced by the physical address.

8. The processing system of claim 4, wherein the cache controller is configured to retrieve the cache repair data from a location of the first cache repair memory portion, the location identified by an index of an entry of the second cache repair memory portion storing at least one of: at least part of the physical address and an identifier of a cache way that stores a data item referenced by the physical address.

9. The processing system of claim 4, wherein the cache controller is further configured, responsive to receiving a write request comprising a data item and a second physical address, to:
store the data item in a cache location identified by the second physical address,
store at least part of the data item in a location of the first cache repair memory portion, the location identified by an index of an entry of the second cache repair memory portion storing at least one of: at least part of the second physical address and an identifier of a cache way that stores a data item referenced by the second physical address.

10. A method, comprising:
receiving, by a processing system, a cache read request referencing a physical address;
retrieving cache data from a cache location identified by the physical address;
retrieving, from the cache repair memory a bit repair value associated with a specific bit of the cache location, a column repair value associated with a specific column of the cache location, and a row repair value associated with a specific row of the cache location;

producing cache repair data by multiplexing the bit repair value, the column repair value, and the row repair value; and outputting the cache data multiplexed with the cache repair data.

11. The method of claim 10, wherein retrieving the cache repair data is performed within two or more pipeline stages separating identification of an LLC hit and availability of the cache data.

12. The method of claim 10, further comprising:
initializing the cache repair memory by reading a programmable circuit associated with the cache.

13. The method of claim 10, wherein the cache repair memory comprises a first cache repair memory portion to store the cache repair data and a second cache repair memory portion to store identifiers of cache locations for which the cache repair data is stored by the first cache repair memory portion.

14. The method of claim 13, wherein the first cache repair memory portion is provided by a register file and the second cache repair memory portion is provided by a content-addressable memory.

15. The method of claim 13, wherein an identifier of a cache location comprises at least one of: at least part of the physical address and an identifier of a cache way that stores a data item referenced by the physical address.

16. The method of claim 10, wherein retrieving the cache repair data comprises identifying a location of the first cache repair memory portion by an index of an entry of the second cache repair memory portion storing at least one of: at least part of the physical address and an identifier of a cache way that stores a data item referenced by the physical address.

17. The method of claim 10, further comprising:
receiving a write request comprising a data item and a second physical address;

storing the data item in a cache location identified by the second physical address;

storing at least part of the data item in a location of the first cache repair memory portion, the location identified by an index of an entry of the second cache repair memory portion storing at least one of: at least part of the second physical address and an identifier of a cache way that stores a data item referenced by the second physical address.

18. A system-on-chip (SoC), comprising:
a system memory;
a cache to store contents of at least a subset of the system memory in the cache;
a cache controller communicatively coupled to the cache;
a cache repair memory communicatively coupled to the cache controller;
a processing core communicatively coupled to the memory and to the cache controller;
wherein the cache controller is configured, responsive to receiving a read request referencing a physical address, to:
retrieve cache data from a cache location identified by the physical address,
retrieve, from the cache repair memory a bit repair value associated with a specific bit of the cache location, a column repair value associated with a specific column of the cache location, and a row repair value associated with the a specific row of cache location,
produce cache repair data by multiplexing the bit repair value, the column repair value, and the row repair value, and
output the cache data multiplexed with the cache repair data.

* * * * *